(12) United States Patent
Shah et al.

(10) Patent No.: US 10,538,861 B1
(45) Date of Patent: Jan. 21, 2020

(54) SCINTILLATOR CRYSTAL GROWTH USING NON-STOICHIOMETRIC MELTS

(71) Applicant: Radiation Monitoring Devices, Inc., Watertown, MA (US)

(72) Inventors: Kanai S. Shah, Watertown, MA (US); Josh Tower, Natick, MA (US); Rastgo Hawrami, Watertown, MA (US)

(73) Assignee: Radiation Monitoring Devices, Inc., Watertown, MA (US)

( * ) Notice: Subject to any disclaimer, the term of this patent is extended or adjusted under 35 U.S.C. 154(b) by 307 days.

(21) Appl. No.: 14/608,665

(22) Filed: Jan. 29, 2015

Related U.S. Application Data

(60) Provisional application No. 61/933,084, filed on Jan. 29, 2014.

(51) Int. Cl.
| | |
|---|---|
| *C30B 29/12* | (2006.01) |
| *C09K 11/77* | (2006.01) |
| *C30B 13/16* | (2006.01) |
| *C30B 11/02* | (2006.01) |
| *C30B 15/00* | (2006.01) |

(52) U.S. Cl.
CPC ............. *C30B 29/12* (2013.01); *C09K 11/77* (2013.01); *C30B 11/02* (2013.01); *C30B 13/16* (2013.01); *C30B 15/00* (2013.01)

(58) Field of Classification Search
CPC combination set(s) only.
See application file for complete search history.

(56) References Cited

U.S. PATENT DOCUMENTS

| | | | |
|---|---|---|---|
| 7,655,919 B1 * | 2/2010 | Shah ...................... | G01T 1/202 250/370.11 |
| 2006/0086311 A1 * | 4/2006 | Zagumennyi ........... | C04B 35/16 117/13 |
| 2008/0131347 A1 * | 6/2008 | Srivastava ......... | C09K 11/7705 423/263 |

OTHER PUBLICATIONS

Aull et al. Impact of ion-host interactions on the 5d-to-4f spectra of lanthanide rare-earth-metal ions. II. The Ce-doped elpasolites, Nov. 1986, Physical Review B, vol. 34, No. 10, pp. 6647-6655.*

* cited by examiner

*Primary Examiner* — Erin F Bergner
(74) *Attorney, Agent, or Firm* — Wolf, Greenfield & Sacks, P.C.

(57) ABSTRACT

Disclosed embodiments are related to a method of forming an elpasolite scintillator. In one nonlimiting embodiment, a method of forming an elpasolite scinitillator may comprise forming an elpasolite crystal from a nonstoichiometric melt.

6 Claims, 5 Drawing Sheets

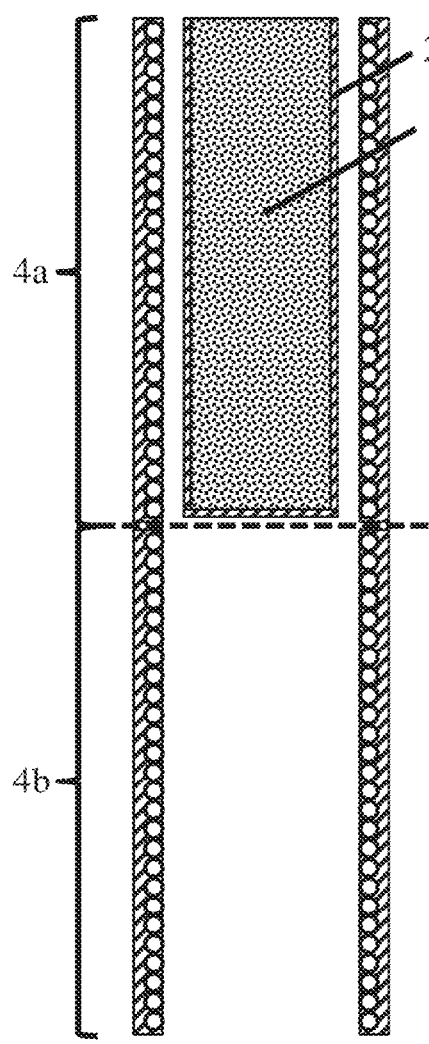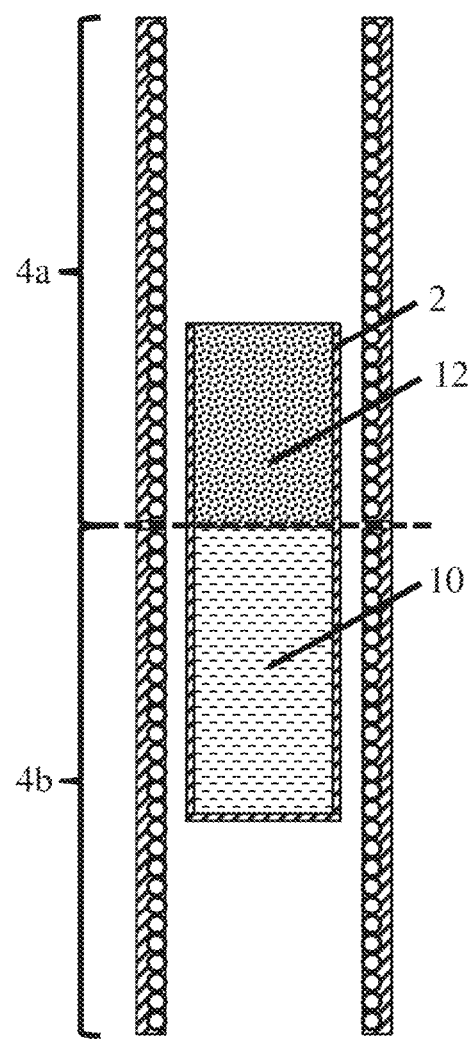
Fig. 2A         Fig. 2B
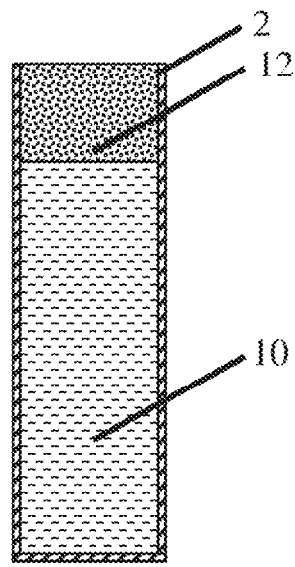
Fig. 2C

SCINTILLATOR CRYSTAL GROWTH USING NON-STOICHIOMETRIC MELTS

RELATED APPLICATIONS

This application claims priority to U.S. Provisional Application No. 61/933,084, filed Jan. 29, 2014, which is incorporated herein by reference in its entirety.

GOVERNMENT LICENSE RIGHTS

This invention was made with government support under contract HSHQDC-09-C-00158 awarded by the Department of Homeland Security, Domestic Nuclear Detection Office and contract DTRA01-02-D-0067 awarded by the Department of Defense, Defense Threat Reduction Agency. The government has certain rights in the invention.

FIELD

Disclosed embodiments are related to scintillator crystal growth using nonstoichiometric melts.

BACKGROUND

Scintillators are widely used detectors for spectroscopy of energetic photons (e.g. X-rays and gamma-rays) as well as neutrons. These detectors are commonly used in nuclear and high energy physics research, medical imaging, diffraction, non-destructive testing, geological exploration, and other applications. Important properties for the scintillation crystals used in these applications include high light output, high gamma ray stopping efficiency (attenuation), fast response, low cost, good proportionality, minimal afterglow, and/or pulse shape discrimination. $^3$He based gaseous detectors have been commonly used in thermal neutron detection applications. However, the forecasted decrease in the future supply of $^3$He has created uncertainty in the area of thermal neutron detection. Promising neutron scintillators include elpasolite compositions such as $Cs_2LiYCl_6$ (CLYC) and $Cs_2LiLaCl_6$ (CLLC). In these compositions, the presence of Li in their unit cell can provide efficient detection of thermal neutrons. Generally, an elpasolite might be considered to have a formula of $A_2BCD_6$. In this formula A and B typically refer to alkali metals though other materials are also possible. Additionally C might be a rare-earth transition metal or other trivalent ion. D may also be an appropriate halogen such as fluorine (F), chlorine (Cl), bromine (Br), or iodine (I). Typically, elpasolites are cubic (a double perovskite structure).

SUMMARY

In one embodiment, a method of forming an elpasolite scintillator may include: forming a stoichiometric elpasolite crystal from a nonstoichiometric melt.

In another embodiment, a method of forming an elpasolite scintillator may include: passing a nonstoichiometric molten zone from a first end of a stoichiometric material charge towards a second end of the stoichiometric material charge; and forming a stoichiometric elpasolite crystal as the nonstoichiometric molten zone is moved from the first end towards the second end.

In yet another embodiment, a method of forming an elpasolite scintillator may include: melting a nonstoichiometric material charge; and cooling the nonstoichiometric material charge from a first end towards a second end, wherein a stoichiometric elpasolite crystal forms as the nonstoichiometric material charge is cooled from the first end towards the second end.

It should be appreciated that the foregoing concepts, and additional concepts discussed below, may be arranged in any suitable combination, as the present disclosure is not limited in this respect. Further, other advantages and novel features of the present disclosure will become apparent from the following detailed description of various non-limiting embodiments when considered in conjunction with the accompanying figures.

BRIEF DESCRIPTION OF DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings:

FIG. 2A is a schematic representation of a molten nonstoichiometric material charge;

FIG. 2B is a schematic representation of the molten nonstoichiometric material charge of FIG. 2A after partial crystal growth;

FIG. 2C is a schematic representation of the resulting boule after crystal growth from the molten nonstoichiometric material charge of FIG. 2A;

DETAILED DESCRIPTION

Figure 1A:
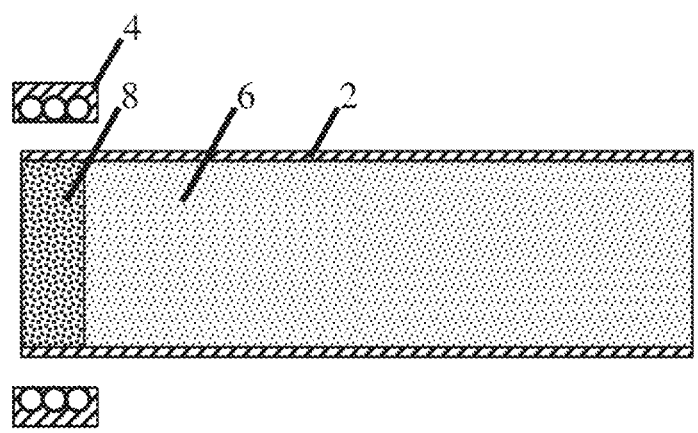
FIG. 1A is a schematic representation of a stoichiometric material charge and a nonstoichiometric molten zone.

The inventors have recognized several issues concerning the growth of stoichiometric single crystal elpasolites. Specifically, large portions of the as formed elpasolite boule may be unusable due to the formation of secondary phases before and after formation of a desired stoichiometric elpasolite crystal. For example, during $Cs_2LiYCl_6$ (CLYC) crystal growth from a stoichiometric melt corresponding to the composition of CLYC, a cesium rich phase is formed at a tip of the boule prior to CLYC formation and a lithium rich phase is formed at a tail of the boule after CLYC formation. Formation of these secondary phases can lead to grain boundary formation and cracking of the boule. Therefore, the inventors have recognized a need to reduce, or eliminate, the formation of these secondary phases during crystal growth.

As detailed below, the inventors have recognized that elpasolite crystals form from nonstoichiometric melts with compositions that are different from the composition of the stoichiometric elpasolite. Therefore, the inventors have recognized that forming an elpasolite crystal from a nonstoichiometric melt may reduce or eliminate the initial formation of a secondary phase prior to formation of the elpasolite crystal. Without wishing to be bound by theory, this may help to improve the boule yield and reduce the formation of grain boundaries within the elpasolite crystals. Such a growth method can be implemented using any appropriate crystal growth method including crystal growth methods such as the traveling heater method, Bridgeman method, Czochralski method, and float zone method to name a few. These growth methods may also be applied to any number of different elpasolite materials as described in more detail below. Additionally, depending on the embodiment, the nonstoichiometric melt may include a concentration of an alkali metal that is greater than the concentration of the alkali metal in the stoichiometric elpasolite crystal. While any appropriate alkali metal might be used depending on the composition of an elpasolite crystal being grown, in some embodiments the alkali metal may be lithium, sodium, or a combination of the two.

In one nonlimiting embodiment, a stoichiometric material charge and a localized nonstoichiometric zone may be initially provided within a container. A portion of the material charge may be melted to form a localized molten zone within the solid stoichiometric material charge. For example, an end of the material charge might be melted to form the molten zone. This molten zone may also have a composition that is different from the stoichiometric composition of the desired crystal. Thus, it may be considered to be a nonstoichiometric molten zone. The nonstoichiometric molten zone may then be passed from a first end of the stoichiometric material charge to a second end of the stoichiometric material charge. The composition and size of the nonstoichiometric molten zone may remain substantially constant throughout this process. As the nonstoichiometric molten zone passes through the solid stoichiometric material charge, a stoichiometric crystal may be formed. In some instances, the stoichiometric crystal may be a stoichiometric single crystal. Without wishing to be bound by theory, the resulting boule may include a stoichiometric crystal that is capped by a nonstoichiometric material corresponding to material in the nonstoichiometric molten zone. Due to the composition and size of the nonstoichiometric molten zone remaining substantially constant, the amount of remaining nonstoichiometric material may be equal to the initial amount of material present within the nonstoichiometric molten zone. This method may be implemented using any appropriate system. However, in some embodiments, a crystal growth method such as the traveling heater method might be used to implement this crystal growing method.

The nonstoichiometric molten zone may be provided in any appropriate fashion. For example, the nonstoichiometric molten zone may be formed by adding a material to one end of a container including a solid stoichiometric material charge prior to locally melting the material. In some instances, the composition of this material may correspond to the desired nonstoichiometric composition. In other instances, the composition of this material may be selected such that it may be combined with a predetermined amount of stoichiometric material from the material charge to provide a desired nonstoichiometric composition. For example, a lithium rich material might be added to one end of a material charge to provide a lithium rich molten zone.

In another nonlimiting embodiment, a material charge with a composition that is different from a desired stoichiometric crystal, i.e. a nonstoichiometric material charge, may be melted within a container. The melted nonstoichiometric material charge may subsequently be cooled from a first end of the material charge to a second end of the material charge. Without wishing to be bound by theory, as the material is cooled, a solidification front corresponding to the formation of a stoichiometric crystal may pass from the first end towards the second end. In some embodiments, the stoichiometric crystal may be a single crystal. As solidification of the stoichiometric crystal continues, the composition of the molten nonstoichiometric material charge will continue to change until it is no longer possible to form the desired stoichiometric crystal. At this point, the remaining material charge may form a secondary phase located at the second end of the material charge. The amount of remaining material after formation of the stoichiometric crystal will depend on the amount of initial material and a difference between a composition of the initial nonstoichiometric melt and the stoichiometric crystal. This method may be implemented using any appropriate system. However, in some embodiments, a crystal growth method such as a vertical or horizontal Bridgeman method might be used.

The currently disclosed crystal growth methods may be used with any appropriate elpasolite composition. For example, these methods might be used with materials such as a $Cs_2LiLn$ Halide and/or $Cs_2NaLn$ Halide compositions which may be represented by the formulas $Cs_2LiLnZ_6$ and $Cs_2NaLnZ_6$, where Z is a halide. Suitable halides can include, for example, F, Cl, Br, or I. However, in some embodiments, a mixture of two or more halides might be used. Lanthanides (or "Ln") can include lanthanides such as Y, La, Ce, Gd, Lu, Sc, etc. It should be understood though that in some embodiments, the composition may include a mixture of lanthanide elements. Possible exemplary elpasolite compositions may include, but are not limited to, $Cs_2LiYCl_6$, (CLYC) $Cs_2LiLaF_6$ (CLLF), $Cs_2LiLaCl_6$ (CLLC), $Cs_2LiLaBr_6$ (CLLB), $Cs_2LiYBr_6$ (CLYB), and/or $Cs_2LiLaI_6$ (CLLI), $Cs_2NaLaBr_6$ (CNLB), $Cs_2NaGdI_6$ (CNGI), $Cs_2NaLaI_6$ (CNLI), $Cs_2NaLuI_6$ (CNLuI), $Cs_2NaLaF_6$ (CNLF), and/or $Cs_2NaLaCl_6$ (CNLC).

Depending on the particular embodiment, a mixed halide scintillator composition might be used. For example, a mixture of two or more of $Cs_2LiLaF_6$, $Cs_2LiLaCl_6$, $Cs_2LiLaBr_6$, and $Cs_2LiLaI_6$. Alternatively, in another possible embodiment, mixtures of $Cs_2NaLaBr_6$ (CNLB), $Cs_2NaLaI_6$ (CNLI), $Cs_2NaLaF_6$ (CNLF), and/or $Cs_2NaLaCl_6$ (CNLC) might be used. Other mixtures including mixtures including both lithium and sodium as well as various types of lanthanides might also be used. Therefore, it should be understood that the disclosure is not limited to any particular mixture of the above-noted materials and that combinations with other materials not listed are also possible.

As described in more detail below with regards to the examples, $Cs_2LiLnZ_6$ based materials form from a lithium rich nonstoichiometric melts. Similarly, at least some mixed materials including both $Cs_2LiLnZ_6$ and $Cs_2NaLnZ_6$ are also expected to form from nonstoichometric melts. Therefore, in some embodiments, the nonstoichiometric melt used to form a desired stoichiometric elpasolite crystal may include a concentration of an alkali metal that is greater than the concentration of the alkali metal in the stoichiometric elpasolite crystal. Possible compositional ranges are provided in more detail below. While any appropriate alkali metal might be used depending on the composition of the desired elpasolite crystal being grown, in some embodiments the alkali metal may be at least one of lithium and sodium. In instances where the elpasolite crystal composition includes both lithium and sodium, the initial melt used to form the materials may be enriched in both lithium and sodium, or it might be enriched in only one of lithium and sodium, as the disclosures not so limited. The specific range of concentrations of these materials that might be used will vary depending on the particular stoichiometric elpasolite crystal being grown.

In some embodiments, the above noted scintillator compositions may also include a dopant or a mixture of dopants. Dopants can affect certain properties, such as physical properties (e.g., brittleness, etc.) as well as scintillation properties (e.g., luminescence, etc.) of the scintillator composition. The dopant can include, for example, cerium (Ce), praseodymium (Pr), lutetium (Lu), lanthanum (La), europium (Eu), samarium (Sm), strontium (Sr), thallium (Ti), chlorine (Cl), fluorine (F), iodine (I), and mixtures of any of the dopants. Where certain halides are included as dopants, such dopants will be present in the scintillator composition in addition to those halide(s) already otherwise present in the scintillator compound. The amount of dopant present will depend on various factors, such as the application for which the scintillator composition is being used; the desired scintillation properties (e.g., emission properties, timing resolution, etc.); and the type of detection device into which the scintillator is being incorporated. For example, a dopant may be employed at a concentration in the range of about 0.01% to about 20%, by molar weight. In certain embodiments, the amount of dopant may be in the range of about 0.01% to less than about 100% by molar weight (and any integral number therebetween), or less than about 0.1%, 1.0%, 2.0%, 5.0%, or 20% by molar weight.

In some embodiments, the lithium content of the composition may be enriched to include a Li-6 content that is greater than that which is found in naturally occurring lithium sources. Without wishing to be bound by theory, enrichment refers to a change through processing of a naturally occurring nuclear species mixture found on Earth so that the resultant material has a different mix of nuclear species. In naturally occurring sources of lithium, 93% of the lithium is in the form of Li-7 or $^7$Li, having an atomic weight of approximately seven and a nucleus with three protons (defining the chemical species) and four neutrons. Approximately 7% of naturally occurring lithium is Li-6 or $^6$Li, which has an atomic weight of approximately six, including three protons and three neutrons. Therefore, in embodiments where the Li-6 content is enriched to be greater than naturally occurring lithium, compositions might include lithium with a Li-6 content that is at least about 10% or greater, 50% or greater, and in some instances about 80%, 90%, 95% or greater (as well as any integral number in the specified ranges). While the Li-6 content has been described as being enriched, embodiments in which the Li-6 content is reduced and the Li-7 content is enriched are also possible. Additionally, it should be understood that while in some embodiments the material may be enriched, the disclosed methods may be used with unenriched materials as well.

Although the chemical properties are substantially similar, the physical (weight) and nuclear properties of Li-6 versus Li-7 is significantly different. For example the neutron interaction cross-section of Li-6 is larger than that of Li-7. Therefore, and without wishing to be bound by theory, enriched compositions may provide significantly greater neutron detection efficiency per unit thickness compared to a corresponding non-enriched composition. In many instances, enriched scintillator compositions may provide thin scintillators that are high-efficiency neutron detecting scintillators. While enriched lithium has been discussed above, any other appropriate element, including for example, chlorine, might be enriched as well as the current disclosure is not so limited.

The noted scintillator compositions may be substantially pure (e.g., about 99% scintillator composition or greater) or they may contain certain amounts of other compounds or impurities. In some cases, impurities may originate, for example, with starting materials for composition preparation. Typically, impurities may constitute less than about 0.1% by weight of the scintillator composition, and often less than about 0.01% by weight of the composition. In some instances, minor amounts of other materials may be purposefully included in the scintillator compositions. For example, minor amounts of other rare earth metals and/or oxides can be added to affect scintillation properties, such as reduce afterglow, and the like.

While phase diagrams can be experimentally determined, or possibly derived from existing binary phase diagrams, to determine appropriate starting compositions for forming an elpasolite crystal, other methods of determining appropriate starting melt compositions are also possible. For example in one embodiment, an appropriate initial melt composition may be determined by first forming a crystal from a stoichiometric melt. The Crystal may be grown using any appropriate method such as, for example, the vertical Bridgman method. As noted above, in the case of CLYC the resulting boule will include an initial cesium rich secondary phase formed at the tip. Without wishing to be bound by theory, the composition of the melt when the secondary phase finished forming and the elpasolite crystal started forming corresponds to the beginning of the elpasolite forming region. This melt composition can be determined by weighing the entire ingot and then separately weighing the cesium rich secondary phase by itself. The composition of the cesium rich secondary phase can then be determined using any appropriate method such as chemical or x-ray analysis. For example, in CLYC, the secondary phase has been found to be $Cs_3YCl_6$. The number of moles of each element in the starting melt can then be calculated using the weight of the whole ingot and/or the starting raw materials. Separately, the number of moles of each element in the Cs-rich secondary phase can be calculated from the measured weight and composition of that phase. To determine the composition of the melt when the elpasolite crystal started to form, the moles of each element in the cesium rich phase can be subtracted from the starting composition. The remainder is the melt composition when the elpasolite first began to grow and is at least one optimal initial melt composition for crystal formation. However, it should be understood that other starting compositions are also possible.

Applying the above principles, and the phase diagram described in more detail below, one possible range of nonstoichiometric melt compositions was determined for CLYC. For example, the stoichiometric melt composition for CLYC can be made with the binary components CsCl, LiCl, and $YCl_3$ in the molar proportions 50%, 25%, and 25% respectively. However, the appropriate nonstoichiometric melt composition for growth of stoichiometric CLYC crystal might range from approximately 30% LiCl:45% CsCl to 50% LiCl:25% CsCl while the $YCl_3$ component remains 25% throughout. Alternatively, the $YCl_3$ component could vary with corresponding changes in the other components, as depicted by the CLYC region in the phase diagram. Therefore, the lithium content of the melt may range between about 12% to about 20% during elpasolite crystal formation. The above percentages are molar percentages.

Without wishing to be bound by theory, since the melt composition will become progressively more lithium rich, and correspondingly cesium depleted, throughout the course of crystal growth, the optimal starting composition is the minimum lithium rich point at which the elpalolite crystal will grow. In the CLYC example provided, that composition would be approximately 30% LiCl, or 12% lithium. By selecting the starting point this way, the ingot may nucleate from the onset of solidification with the desired elpasolite composition and grow that desired composition for the largest percentage of the ingot before the melt becomes too Li-rich and the desired composition is no longer formed. While it may be desirable to provide an initial melt composition with the lowest possible lithium concentration, initial melt compositions with a lithium content greater than this are also possible. Additionally, since similar secondary phases are seen during the growth of other elpasolite compositions the use of other nonstoichiometric melt compositions that are rich in lithium, sodium, or other appropriate materials are also expected to offer the benefits of growing an elpasolite crystal with reduced or eliminated secondary phases.

Turning now to the figures, several nonlimiting embodiments are described in more detail. Additionally, for the sake of clarity, the embodiments are discussed with regards to a stoichiometric and a nonstoichiometric composition corresponding to CLYC. However, it should be understood that the described methods can be used with other appropriate elpasolite materials as well.

Figure 1B:
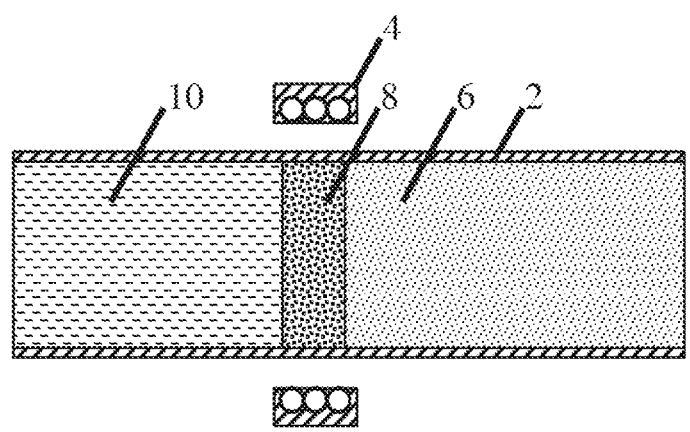
FIG. 1B is a schematic representation of the stoichiometric material charge and the nonstoichiometric molten zone of FIG. 1A after partial crystal growth.
Figure 1C:
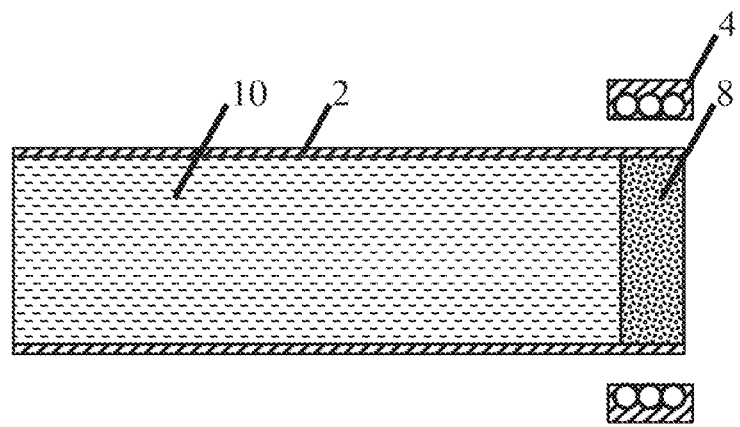
FIG. 1C is a schematic representation of the stoichiometric material charge and the nonstoichiometric molten zone of FIG. 1A after crystal growth.

FIGS. 1A-1C depict an embodiment of a stoichiometric crystal grown using a traveling heater method. It should be understood, that this process may be performed either horizontally or vertically as the disclosure is not so limited. As depicted in the figure, a stoichiometric material charge 6 is located within any appropriate container 2 such as, for example, an ampoule, boat, or crucible. A nonstoichiometric molten zone 8 is located on a first end of the stoichiometric material charge 6. The nonstoichiometric molten zone 8 may be maintained in the molten state using a movable heater 4. Alternatively, the container 2 might be movable relative to the heater 4. In the case of a stoichiometric material charge being used to grow a CLYC crystal, the nonstoichiometric molten zone may be lithium rich. As the heater 4 is passed from the first end of the stoichiometric material charge 6 to the opposing second end of the stoichiometric material charge 6, the lithium rich nonstoichiometric molten zone 8 passes through the material and a stoichiometric crystal 10 is formed, see FIG. 1B. In some instances, the stoichiometric crystal 10 is a stoichiometric single crystal. Without wishing to be bound by theory, as the Li rich nonstoichiometric zone moves through the stoichometric material charge 6, the melt composition may stay the same because the feed source, i.e. the material charge 6, is substantially the same composition as the resulting stoichiometric crystal 10. This may also result in the amount of nonstoichometric material being substantially the same prior to, during, and after crystal formation. After the heater 4 has been moved to the second opposing end of the material charge, the stoichiometric crystal 10 is fully formed and the remaining nonstoichiometric molten zone 8 is located at the second end of the material charge and may be subsequently cooled to form a secondary phase. This approach may offer the advantage of a melt composition that stays the same throughout the process while also minimizing the formation of secondary phases such as cesium and lithium rich phases.

FIGS. 2A-2C depict an embodiment of a stoichiometric crystal being grown using a Bridgman growth setup. It should be understood, that this process may be performed either horizontally or vertically as the disclosure is not so limited. As depicted in the figure, a nonstoichiometric material charge 12 is located within any appropriate container 2 such as, for example, an ampoule, boat, or crucible. Initially, container 2 is located within a first heating zone 4a which is maintained at a first temperature which is greater than a melting temperature of the nonstoichiometric material charge, see FIG. 2A. Therefore, the nonstoichiometric material charge may be maintained in the molten state. Subsequently, the container 2 may be moved such that it, and the nonstoichiometric material charge 12 contained therein, enters the second heating zone 4b which is maintained at a second temperature which is less than the first temperature, see FIG. 2B. As the nonstoichiometric material charge 12 cools, a stoichiometric crystal 10 may form from the tip of the container. In some instances, the stoichiometric crystal may be a stoichiometric single crystal. Similar to the above, when growing a CLYC crystal, the nonstoichiometric material charge may be lithium rich. Therefore, since the stoichiometric crystal 10 has a lithium content that is less than the nonstoichiometric melt, as crystal formation continues, the nonstoichiometric material charge 12 will continue to increase in lithium content until a CLYC crystal is unable to form. At this point, the remaining amount of lithium rich nonstoichiometric material may form a lithium rich secondary phase on an end of the stoichiometric crystal as depicted in FIG. 2C.

Without wishing to be bound by theory, the above noted Bridgman method results in the melt composition changing continually throughout the course of crystal growth. In contrast, the traveling heater method may provide a substantially constant melt composition and a substantially constant amount of nonstoichiometric material within the molten zone. Consequently, the tail end of a crystal grown using the traveling heater method may have a smaller amount of remaining nonstoichiometric material as compared to the Bridgman method because the relatively small molten zone used in the traveling heater method is the only part that needs to be lithium rich as compared to the entire material charge being Li-rich in the Bridgeman method. Since the residual lithium rich phase may result in cracking of the formed stoichiometric crystal, the traveling heater method may also reduce the chance of cracking due to the presence of a smaller residual amount of the lithium rich secondary phase after crystal formation. Additionally, the traveling heater method may also provide greater crystal yields as compared to the Bridgeman method since substantially the entire feed material may be converted into the desired crystal using a substantially constant nonstoichiometric molten zone. However, it should be understood that either method may be used, and both methods may reduce or eliminate the formation of an undesired secondary phase, such as a cesium rich phase, prior to crystal formation because of the use of a nonstoichiometric melt. This again may offer the benefit of improved nucleation and reduced grain boundary formation during crystal growth.

While particular arrangements have been discussed above with regards to providing the desired molten zones and temperature controls, it should be understood that the disclosed methods are not limited to any particular system or arrangement. Instead, it should be understood that any appropriate method and/or system capable of providing the desired temperature profiles during crystal formation may be used.

The scintillator materials manufactured using the methods described herein can be used in any number of detectors. The detector may include a scintillator optically coupled to a light photodetector or imaging device. The detector assembly can include a data analysis system to process information from the scintillator and light photodetector. In use, the detector may detect energetic radiation emitted from a source.

A data analysis, or computer, system thereof can include, for example, a module or system to process information (e.g., radiation detection information) from the detector/photodetectors and can also be included in an assembly, and can include, for example, a wide variety of proprietary or commercially available computers, electronics, or systems having one or more processing structures, a personal computer, mainframe, or the like, with such systems often having data processing hardware and/or software configured to implement any one (or combination of) the method steps described herein. Any software will typically include machine readable code of programming instructions embodied in a tangible media such as a memory, a digital or optical recording media, optical, electrical, or wireless telemetry signal recording media, or the like, and one or more of these structures may also be used to transmit data and information between components of the system in any of a wide variety of distributed or centralized signal processing architectures.

The detector assembly typically includes material formed from any appropriate scintillator composition such as, for example, the compositions described herein. The detector further can include, for example, a light detection assembly including one or more photodetectors. Non-limiting examples of photodetectors include photomultiplier tubes (PMT), photodiodes, CCD sensors, image intensifiers, and the like. Choice of a particular photodetector will depend in part on the type of radiation detector being fabricated and on its intended use of the device. In certain embodiments, the photodetector may be position-sensitive.

The detector assemblies themselves, which can include the scintillator and the photodetector assembly, can be connected to a variety of tools and devices, as mentioned previously. Non-limiting examples include monitoring and detection devices, well-logging tools, and imaging devices, such as nuclear medicine devices (e.g., PET). Various technologies for operably coupling or integrating a radiation detector assembly containing a scintillator to a detection device may be used, including various known techniques.

The detectors may also be connected to a visualization interface, imaging equipment, or digital imaging equipment (e.g., pixilated flat panel devices). In some embodiments, the scintillator may serve as a component of a screen scintillator. For example, powdered scintillator material could be formed into a relatively flat plate, which is attached to a film, such as photographic film. Energetic radiation, e.g., X-rays, gamma-rays, neutron, originating from a source, would interact with the scintillator and be converted into light photons, which are visualized in the developed film. The film can be replaced by amorphous silicon position-sensitive photodetectors or other position-sensitive detectors, such as avalanche diodes and the like.

Imaging devices, including medical imaging equipment, such as the PET and SPECT devices, and the like, represent another important application for scintillator compositions grown using the disclosed methods. In PET applications, a radiopharmaceutical or detectable label is administered to a patient and may become concentrated within a specific tissue or organ. Radionuclides from the compound decay and emit positrons. When the positrons encounter electrons, they are annihilated and converted into photons, or gamma-rays. The PET scanner can locate these "annihilations" and thereby reconstruct an image of the tissue/organ for observation. The detector modules in the scanner usually include a number of "cameras" or "detectors," along with the associated circuitry, for detecting annihilation events and reconstructing an image of the patient's tissue or organ. For non-limiting examples of techniques for operably coupling detectors containing a scintillator to a detection device see, e.g., U.S. Pat. No. 6,989,541 (titled "Coincident neutron detector for providing energy and directional information") and commonly owned U.S. Pat. No. 7,173,247, the latter of which is herein incorporated by reference in its entirety.

The following examples are being provided for illustration purposes and are not limiting.

Example: CLYC Crystal Growth

Figure 3:
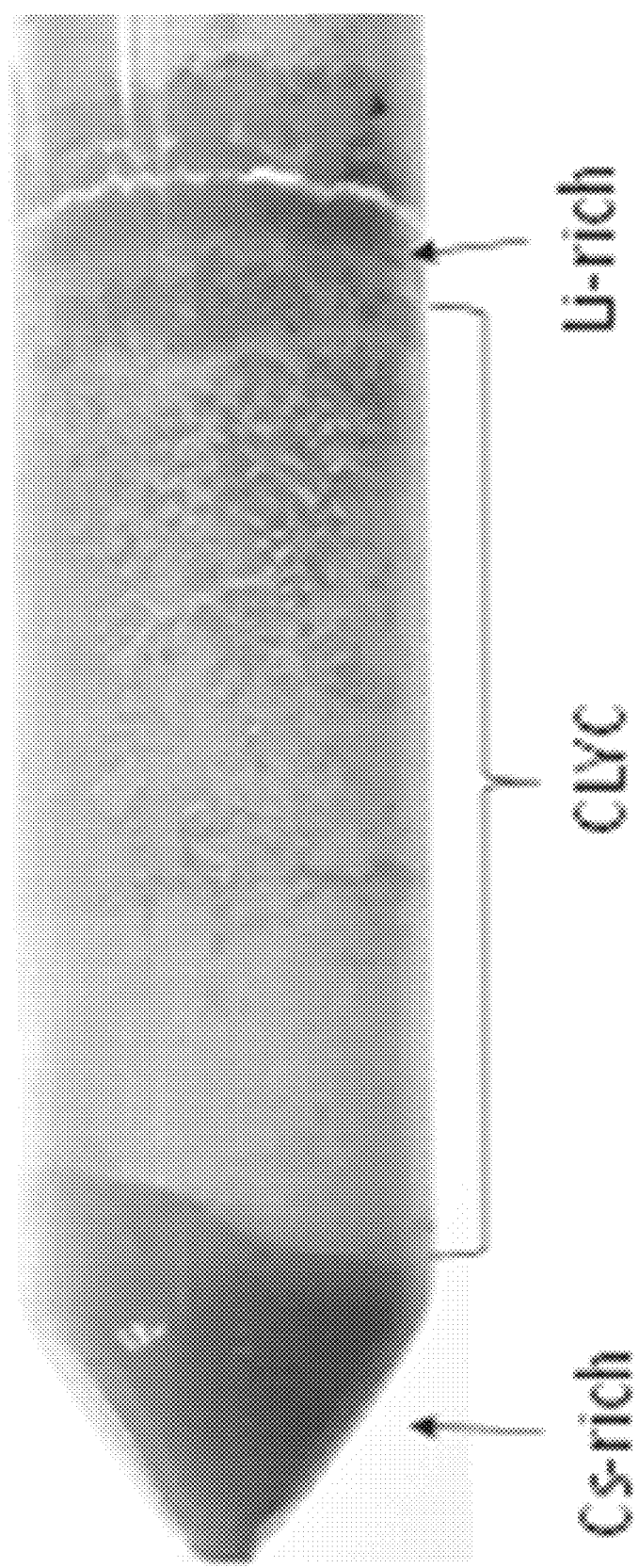
FIG. 3 is a photograph of a $Cs_2LiYCl_6$ (CLYC) boule grown using a stoichiometric material charge.

FIG. 3 presents an image of a CLYC boule grown from a stoichiometric composition. As indicated in the figure, during crystal growth, a cesium rich secondary phase ($Cs_3YCl_6$) nucleated from the melt first and was deposited on one end of the ampoule. Subsequently, CLYC ($Cs_2LiYCl_6$) nucleated and began to grow after the Cs-rich phase was deposited. Without wishing to be bound by theory, this indicates that the CLYC phase was deposited after the melt became sufficiently depleted of cesium. This also corresponds to a melt that is rich in lithium as compared to the stoichiometric CLYC composition. As the crystal continued to grow, the melt composition became progressively more depleted of cesium and enriched in lithium until CLYC could no longer form and a lithium rich secondary phase was formed at the tail of the crystal as indicated in the figure as well.

Example: CLYC Phase Diagram

Figure 4:
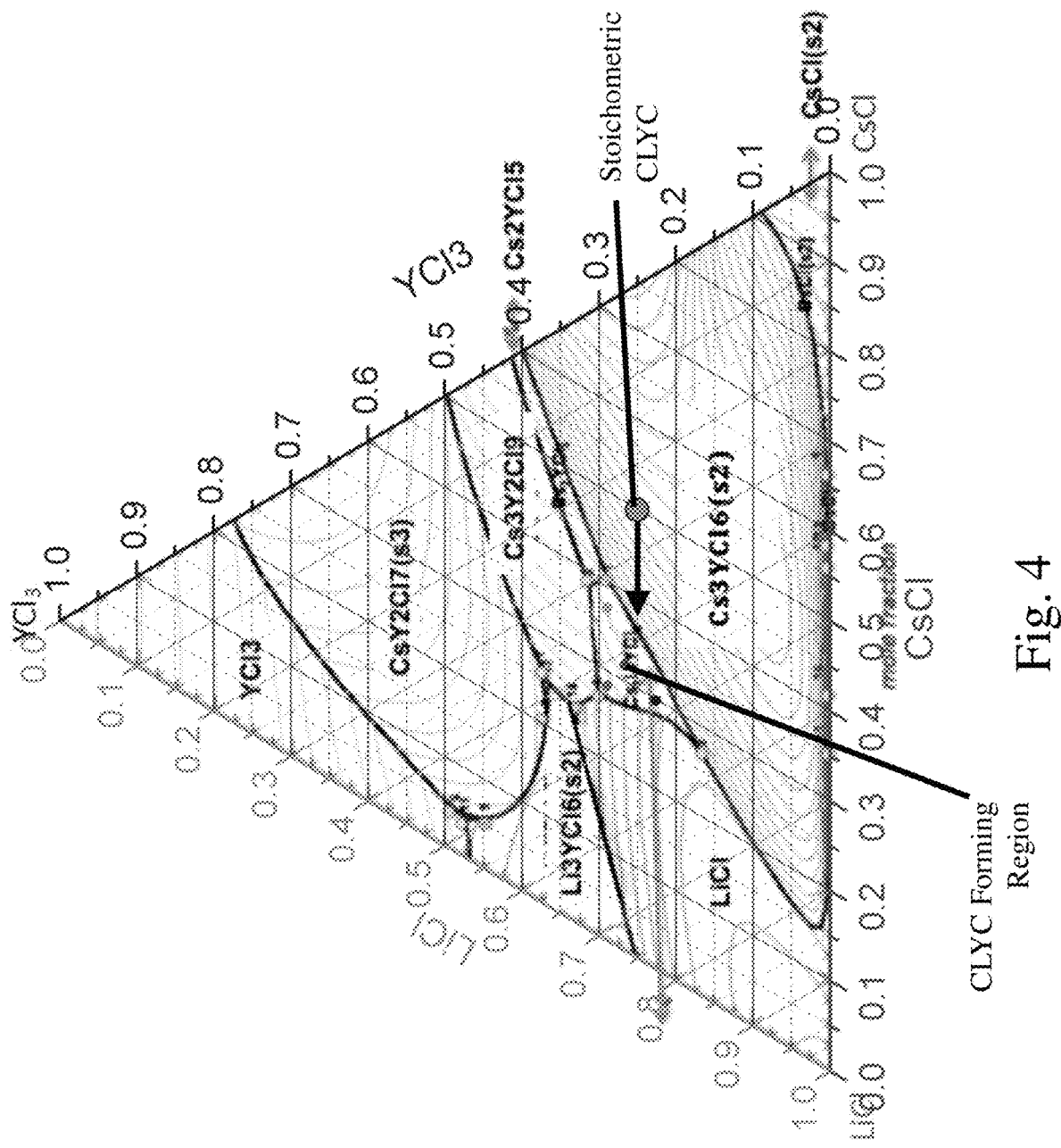
FIG. 4 is a ternary phase diagram for $Cs_2LiYCl_6$ (CLYC) binary systems as determined from experimental data.

Without wishing to be bound by theory, the effect that leads to the different phases forming in the ampoule as noted in the example above can be explained from the phase diagram presented in FIG. 4. The phase diagram was derived from the individual experimental binary phase diagrams of the materials used to form CLYC. It should be noted that the small CLYC formation region is not concurrent with the stoichiometric composition of CLYC. Consequently, and as the phase diagram correctly predicts, the solid composition that forms first from a stoichiometric CLYC melt is $Cs_3YCl_6$. This composition has been confirmed using X-ray diffraction and inductively coupled plasma mass spectrometry measurements. The arrow extending from the initially stoichiometric CLYC composition indicates the evolution of the melt composition as it becomes depleted in cesium. Specifically, the melt becomes lithium rich compared to the stoichiometric composition and moves toward the CLYC formation region. Once a sufficient amount of cesium has been removed from the melt, CLYC begins to form. Thus, and again without wishing to be bound by theory, CLYC solidifies from a lithium rich, or cesium depleted, melt. Similar results for scintillators based on compositions including a mix of lithium and sodium are also expected since these scintillators may also form a cesium rich phase prior to forming the scintillator crystal. Therefore, these scintillators would be expected to form from a melt including greater amounts of lithium and sodium as compared to the stoichiometric crystal.

Example: CLYC Crystal Nucleation vs. Composition

Figure 5:
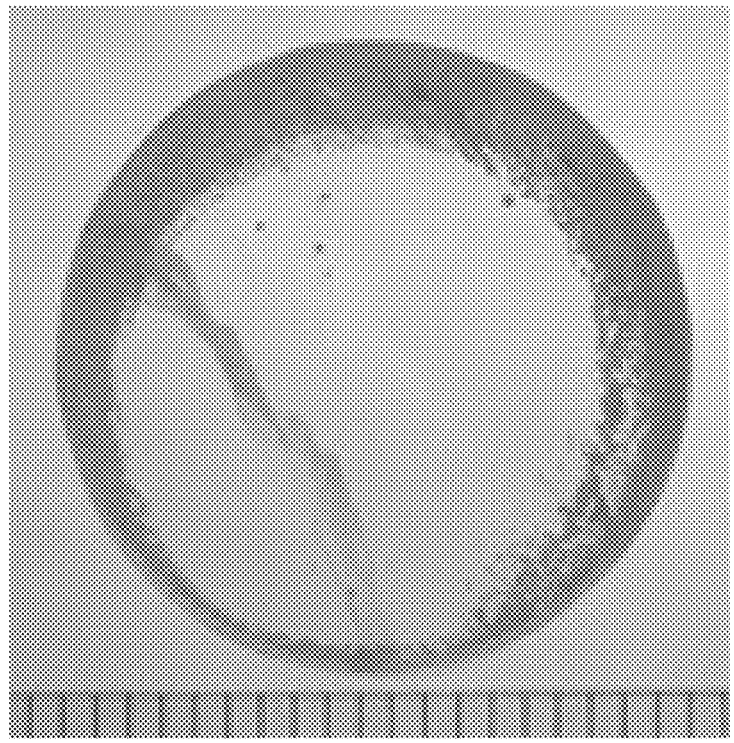
FIG. 5 is a photograph of a CLYC crystal grown from a stoichiometric material charge including a distinct grain boundary.
Figure 6:
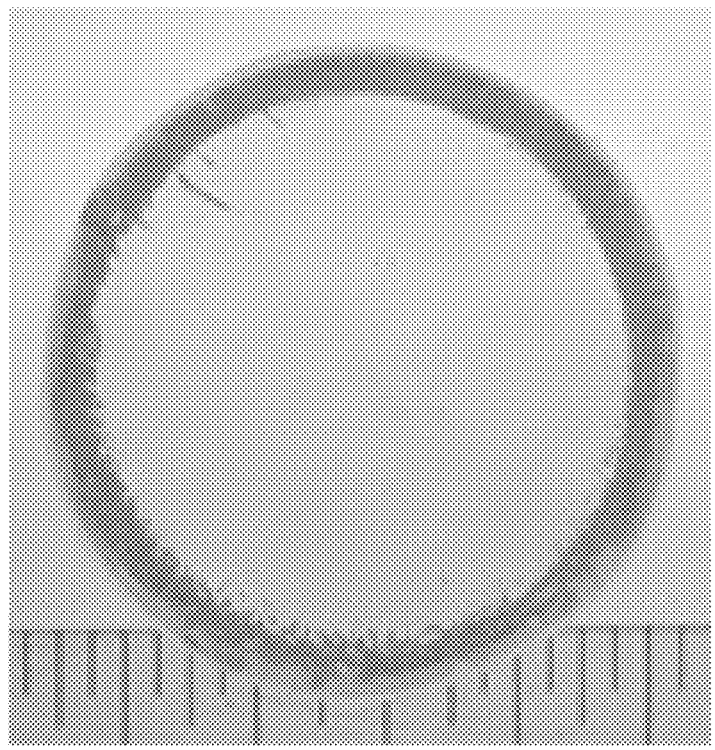
FIG. 6 is a photograph of a CLYC crystal grown from a nonstoichiometric material charge that does not include any observable grain boundaries.

One of the challenges in forming single crystal CLYC from a stoichiometric melt is nucleation and crystal growth of CLYC on top of a cesium rich phase which has a different crystal structure. The difference between the CLYC and underlying crystal structure may result in the formation of grain boundaries that can degrade scintillation performance and lead to cracking. However, CLYC crystal formed without the unwanted cesium rich secondary phase forming first may avoid, or at least reduce, this issue. To illustrate this concept, samples were grown using both stoichiometric and nonstoichiometric melts, FIGS. 5 and 6 respectively. During crystal growth, the stoichiometric melt first formed $Cs_3YCl_6$, not depicted, and the CLYC crystal was nucleated and grown on top of the $Cs_3YCl_6$. This resulted in a grain boundary 12 forming within the CLYC crystal, see FIG. 5. In contrast, and without wishing to be bound by theory, by using a Li rich starting melt, pure CLYC was the initial phase nucleated during solidification of the melt. This resulted in a CLYC crystal being formed that was substantially free of grain boundaries and defects, see FIG. 6. In view of these results, it is believed that the use of a nonstoichiometric melt, such as a Li rich melt, can be used to both improve CLYC yield and performance by reducing the presence of unwanted secondary phases and grain boundary defects.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. A method of forming an elpasolite scintillator, the method comprising:

forming a stoichiometric elpasolite scintillator crystal from a nonstoichiometric melt, wherein the stoichiometric elpasolite crystal and the nonstoichiometric melt comprise an alkali metal and a concentration of the alkali metal in the nonstoichiometric melt is greater than a concentration of the alkali metal in the stoichiometric elpasolite scintillator crystal, wherein the elpasolite scintillator crystal comprises $Cs_2LiLnZ_6$, wherein Z comprises at least one of F, Cl, Br, and I and Ln comprises at least one of Y, La, Ce, Gd, Lu, and Sc.

2. The method of claim 1, wherein the elpasolite scintillator crystal comprises at least one of $Cs_2LiYCl_6$, $Cs_2LiLaF_6$, $Cs_2LiLaCl_6$, $Cs_2LiLaBr_6$, $Cs_2LiYBr_6$, and $Cs2LiLaI6$.

3. The method of claim 1, wherein the elpasolite scintillator crystal is a single crystal.

4. The method of claim 1, wherein the nonstoichiometric melt comprises inclusively between 12% to 20% lithium.

5. The method of claim 1, wherein the stoichiometric elpasolite scintillator crystal is substantially free of grain boundaries.

6. The method of claim 1, wherein the stoichiometric elpasolite scintillator crystal is substantially free of defects.

* * * * *